United States Patent
Tian et al.

(10) Patent No.: US 11,610,597 B2
(45) Date of Patent: Mar. 21, 2023

(54) ANTI-CAUSAL FILTER FOR AUDIO SIGNAL PROCESSING

(71) Applicant: Shure Acquisition Holdings, Inc., Niles, IL (US)

(72) Inventors: Wenshun Tian, Palatine, IL (US); Michael Ryan Lester, Colorado Springs, CO (US)

(73) Assignee: Shure Acquisition Holdings, Inc., Niles, IL (US)

( * ) Notice: Subject to any disclaimer, the term of this patent is extended or adjusted under 35 U.S.C. 154(b) by 94 days.

(21) Appl. No.: 16/888,354

(22) Filed: May 29, 2020

(65) Prior Publication Data

US 2021/0375299 A1  Dec. 2, 2021

(51) Int. Cl.
| | |
|---|---|
| *G10L 21/0232* | (2013.01) |
| *G10L 21/0224* | (2013.01) |
| *G06F 11/34* | (2006.01) |
| *H03M 1/06* | (2006.01) |
| *G10L 19/04* | (2013.01) |

(52) U.S. Cl.
CPC .......... *G10L 21/0224* (2013.01); *G06F 11/34* (2013.01); *G10L 19/04* (2013.01); *H03M 1/0626* (2013.01); *G10L 21/0232* (2013.01)

(58) Field of Classification Search
CPC ... G10L 19/04; G10L 19/008; G10L 21/0224; G10L 21/0232; G10L 21/0272; G10L 19/022; G10L 21/04; G10L 21/0388; G10L 21/038; G10L 19/0017; G10L 2019/0011; G10L 2019/0012; G10L 19/025

USPC .......... 704/500, 501; 375/232, 229, 350; 708/300

See application file for complete search history.

(56) References Cited

U.S. PATENT DOCUMENTS

| | | |
|---|---|---|
| 5,337,264 A | 8/1994 | Levien |
| 5,533,063 A | 7/1996 | Mitra |
| 5,627,859 A | 5/1997 | Parr |
| 6,778,619 B2 * | 8/2004 | Zangi .................... H04L 1/0618 375/232 |
| 6,968,000 B2 | 11/2005 | Schelstraete |
| 6,993,070 B1 * | 1/2006 | Berthet ............. H04L 25/03292 375/232 |
| 7,333,931 B2 | 2/2008 | Bozkurt |

(Continued)

FOREIGN PATENT DOCUMENTS

| | | |
|---|---|---|
| CN | 101361650 | 2/2009 |
| EP | 0565358 | 10/1993 |

(Continued)

OTHER PUBLICATIONS

Abreu, et al., "Nonminimum phase channel equalization using noncausal filters," IEEE Transactions on Signal Processing, vol. 45, No. 1, Jan. 1997, 13 pp.

(Continued)

*Primary Examiner* — Vijay B Chawan
(74) *Attorney, Agent, or Firm* — Neal, Gerber & Eisenberg LLP

(57) ABSTRACT

An audio signal processor includes a digital filter block configured to receive an audio signal and output a first filtered audio signal, and a phase linearization block configured to receive the first filtered audio signal and output a second filtered audio signal with a more linear phase.

20 Claims, 6 Drawing Sheets

(56) References Cited

U.S. PATENT DOCUMENTS

| | | | | |
|---|---|---|---|---|
| 8,781,842 B2* | 7/2014 | Taleb | ............... | G10L 19/04 |
| | | | | 704/500 |
| 8,788,554 B2* | 7/2014 | Christoph | ......... | H03H 21/0012 |
| | | | | 708/301 |
| 2001/0010704 A1* | 8/2001 | Maria Schelstraete | ............... | |
| | | | | H03H 17/08 |
| | | | | 375/229 |
| 2008/0192548 A1* | 8/2008 | Shibata | ............ | G11C 16/16 |
| | | | | 365/185.17 |
| 2008/0253553 A1* | 10/2008 | Li | ............... | H04M 9/082 |
| | | | | 379/406.05 |
| 2011/0216807 A1* | 9/2011 | Christoph | ......... | H03H 21/0012 |
| | | | | 375/E1.001 |
| 2011/0221466 A1* | 9/2011 | Maruyama | ......... | H01L 22/32 |
| | | | | 324/762.01 |
| 2012/0019723 A1* | 1/2012 | McGrath | ......... | H03H 17/08 |
| | | | | 348/E5.062 |
| 2012/0163615 A1* | 6/2012 | Li | ............... | H04M 9/082 |
| | | | | 381/71.1 |
| 2017/0134854 A1* | 5/2017 | Lindahl | ......... | H03H 17/0283 |

FOREIGN PATENT DOCUMENTS

| | | |
|---|---|---|
| EP | 0463781 | 10/1995 |
| EP | 1122884 | 8/2001 |
| EP | 1548940 | 6/2005 |
| EP | 1821407 | 8/2007 |
| EP | 2696546 | 2/2014 |
| WO | 2010117867 | 10/2010 |

OTHER PUBLICATIONS

Chen, et al., "Time-Reversed Infinite Impulse Response Filtering in Digital Communications Receivers," 3rd IEEE International Conference on Universal Personal Communications, Sep. 27-Oct. 1, 1994, 5 pp.

Mouffak, et al., "Noncausal forward/backward two-pass IIR digital filters in real time," Turkish Journal of Electrical Engineering and Computer Sciences, Jan. 2012, 19 pp.

Powell, et al., "A Technique for Realizing Linear Phase IIR Filters," IEEE Transaction on Signal Processing, vol. 39, No. 11, Nov. 1991, 11 pp.

Powell, et al., "Time Reversed Filtering in Real-Time," IEEE International Symposium on Circuits and Systems, 1990, vol. 2, 5 pp.

Sezen, "A Novel Implementation Method for Anticausal IIR Digital Filter Banks," Proc. URSI TURKIYE 2006, 5 pp.

Vaidyanathan, et al., "Structures for Anticausal Inverses and Application in Multirate Filter Banks," IEEE Transactions on Signal Processing, vol. 46, No. 2, Feb. 1998, 8 pp.

Gustafsson, "Determining the Initial States in Forward-Backward Filtering," IEEE Transactions on Signal Processing, vol. 44, No. 4, Apr. 1, 1996, 6 pp.

International Search Report and Written Opinion for PCT/US2021/070620 dated Sep. 21, 2021, 12 pp.

Oppenheim, et al., "Discrete-Time Signal Processing," Prentic Hall, Jan. 1, 1989, p. 284.

Rader, et al., "Approximating Noncausal IIR Digital Filters Having Arbitrary Poles, Including New Hilbert Transformer Designs, Via Forward/Backward Block Recursion," IEEE Transactions on Circuits and Systems Part 1: Regular Papers, vol. 53, No. 12, Dec. 1, 2006, 10 pp.

The MathWorks, Inc., "Anti-Causal, Zero-Phase Filter Implementation," Jan. 1, 1994, Retrieved from web page https://www.mathworks.com/help/signal/ug/anti-causal-zero-phase-filter-implementation.html on Oct. 4, 2021, 2 pp.

* cited by examiner

ANTI-CAUSAL FILTER FOR AUDIO SIGNAL PROCESSING

TECHNICAL FIELD

This application generally relates to audio signal processing. In particular, this application relates to devices and methods for phase linearization of an audio signal using an anti-causal filter.

BACKGROUND

Audio signal processing can be either analog, digital, or a combination of both, and can include filtering the audio signal using a variety of filters. Time-domain digital audio signal filtering can be implemented using one of two classes of digital filters: Finite Impulse Response (FIR) or Infinite Impulse Response (IIR) filters, each of which have certain advantages and disadvantages. One advantage of using a FIR filter is that the resulting output signal has a linear phase (i.e., constant group delay), while an IIR filter produces a non-linear phase in the output signal (i.e., the group delay varies with frequency). Group delay refers to the time delay of the amplitude envelopes of the various sinusoidal components of a signal through a device under test, and is a function of frequency for each component. On the other hand, using an IIR filter can achieve its designed filtering characteristics with fewer calculations, less memory, and lower delay (for the dominant frequency) compared to similar designed filtering characteristics using an FIR filter. However, the trade-off is that the reduced calculations, memory, and delay of an IIR filter result in the non-linear phase or non-constant group delay. The non-constant group delay changes the shape or scale of the resulting output signal in addition to adding a fixed delay. A sufficiently large delay variation can cause problems such as poor fidelity in audio signals.

Accordingly, there is an opportunity for audio signal processing using an IIR filter that does not introduce a non-linear phase to the output signal, and/or for audio signal processing that provides a user with a scalable output (i.e., to trade-off between (1) having a non-linear phase and a relatively low latency, and (2) having a more linear phase and a relatively high latency), to enable the user to customize the output(s) for specific applications and to provide an improved user experience.

SUMMARY

The invention is intended to solve the above-noted problems by providing devices and methods for phase linearization of an audio signal using an anti-causal filter. This enables the user to customize the output based on use in a particular application, and/or based on desired output characteristics of the signal.

In an embodiment, an audio signal processor includes a digital filter block comprising an infinite impulse response filter, wherein the digital filter block is configured to receive an audio signal and output a first filtered audio signal. The audio signal processor also includes a phase linearization block comprising a buffer configured to receive the first filtered audio signal and output a buffer signal. The phase linearization block also includes a filter state estimation block configured to perform historical state reconstruction based on the first filtered audio signal, and to output a state estimation signal. The phase linearization block also includes an anti-causal filter configured to receive the buffer signal and the state estimation signal, and output a second filtered audio signal, wherein an output of the audio signal processor comprises both the first filtered audio signal and the second filtered audio signal.

In another embodiment, a method of operating a digital audio signal processor includes filtering a received audio signal using an infinite impulse response filter, to produce a first filtered audio signal. The method also includes inputting the first filtered audio signal into a phase linearization block, wherein the phase linearization block comprises a buffer configured to receive the first filtered audio signal and output a buffer signal. The phase linearization block also includes a filter state estimation block configured to perform historical state reconstruction based on the first filtered audio signal, and to output a state estimation signal. The phase linearization block also includes an anti-causal filter configured to receive the buffer signal and the state estimation signal, and output a second filtered audio signal. The method further includes outputting both the first filtered audio signal and the second filtered audio signal.

In a further embodiment, a non-transitory, computer-readable memory has instructions stored thereon that, when executed by a processor, cause the performance of a set of acts. The set of acts includes filtering a received audio signal using an infinite impulse response filter, to produce a first filtered audio signal. The set of acts also includes inputting the first filtered audio signal into a phase linearization block, wherein the phase linearization block comprise a buffer configured to receive the first filtered audio signal and output a buffer signal. The phase linearization block also includes a filter state estimation block configured to perform historical state reconstruction based on the first filtered audio signal, and to output a state estimation signal. The phase linearization block also includes an anti-causal filter configured to receive the buffer signal and the state estimation signal, and output a second filtered audio signal. The set of acts further includes outputting both the first filtered audio signal and the second filtered audio signal.

These and other embodiments, and various permutations and aspects, will become apparent and be more fully understood from the following detailed description and accompanying drawings, which set forth illustrative embodiments that are indicative of the various ways in which the principles of the invention may be employed.

DETAILED DESCRIPTION

Figure 1:
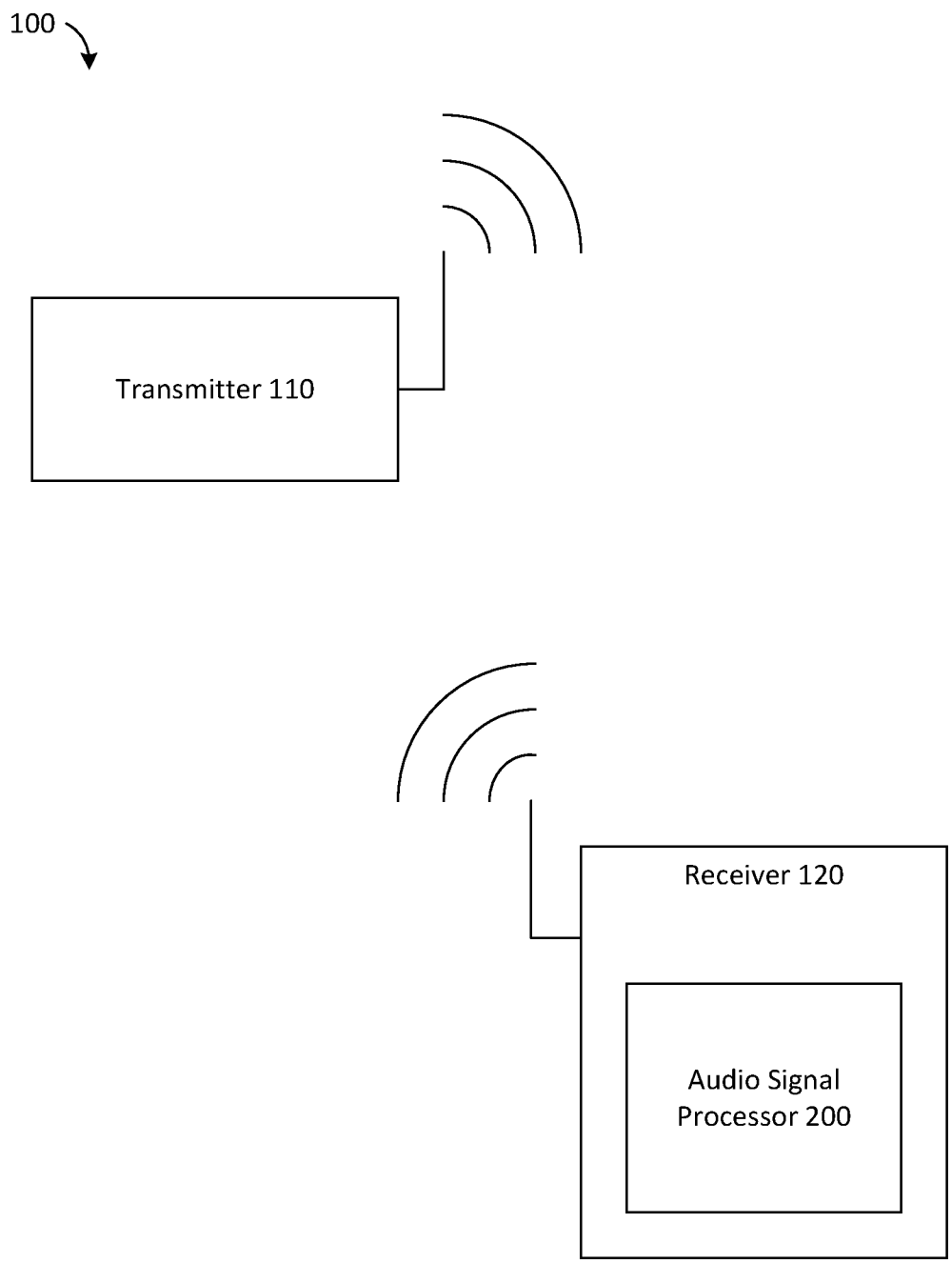
FIG. 1 is a simplified schematic diagram of an example audio system, in accordance with some embodiments.

The description that follows describes, illustrates and exemplifies one or more particular embodiments of the invention in accordance with its principles. This description is not provided to limit the invention to the embodiments described herein, but rather to explain and teach the principles of the invention in such a way to enable one of ordinary skill in the art to understand these principles and, with that understanding, be able to apply them to practice not only the embodiments described herein, but also other embodiments that may come to mind in accordance with these principles. The scope of the invention is intended to cover all such embodiments that may fall within the scope of the appended claims, either literally or under the doctrine of equivalents.

It should be noted that in the description and drawings, like or substantially similar elements may be labeled with the same reference numerals. However, sometimes these elements may be labeled with differing numbers, such as, for example, in cases where such labeling facilitates a more clear description. Additionally, the drawings set forth herein are not necessarily drawn to scale, and in some instances proportions may have been exaggerated to more clearly depict certain features. Such labeling and drawing practices do not necessarily implicate an underlying substantive purpose. As stated above, the specification is intended to be taken as a whole and interpreted in accordance with the principles of the invention as taught herein and understood to one of ordinary skill in the art.

As noted above, embodiments of the present disclosure are directed to filtering of audio signals, in particular filtering using an IIR filter. However, the use of an IIR filter introduces non-linear phase or non-constant group delay. Where the audio signal includes harmonics that happen to fall at or near the peaks in the group delay, for instance where the audio signal includes a complex harmonic tone with a fundamental normalized frequency of 0.125 (e.g., a square wave @ 3 kHz), the timbre of that tone may be altered.

In some cases, to avoid the non-linear phase introduced by an IIR filter, a FIR filter or Weighted-Overlap-Add (WOLA) filter approach can be used. However, these types of filters will have much higher latency than an IIR filter. Other techniques to avoid non-linear phase (i.e., linear phase techniques) can include AAC-ELD, which is essentially formed out of AAC-LD (Low Delay) with 20 ms coding delay and SBR (Spectrum Bandwidth Replication) tools. In AAC-ELD core mode, the overlap-add delay of the filter bank is cut in half to 240 samples, resulting in a minimum algorithmic delay of 15 ms. Another linear phase technique includes a G.729.1 coder which operates on 20 ms frames and has an algorithmic delay of 48.9375 ms. A low-delay mode of G.729.1 has been formed by skipping the inverse MDCT (modified discrete cosine transform) and overlap-add. For an encoder in default mode and a decoder in low delay mode at 14 kbit/s, the algorithmic delay may be reduced to 28.9375 ms.

All these linear phase techniques, however, introduce a relatively large latency or delay. For delay-critical applications, such as performance monitors, or network music performance, the delay introduced by the example linear phase techniques noted above may still be too high to meet the ultra-low delay requirements. Some known techniques such as Ultra-Low-Delay (ULD) uses a 512-sample window with 12 ms delay, and OPUS CELT can be parameterized to use 2.5 ms window with 5 ms delay. For these type of low-delay implementations, the performance will be compromised due to the low frequency resolution and low subband isolation necessitated by shorter windows.

Rather than using the approaches noted above (i.e., a linear phase filter band with either a relatively long delay or short delay), embodiments of the present disclosure make use of phase linearization, which includes an anti-causal filter. This enables higher stop-band attenuation with controllable latency. Embodiments of the present disclosure provide a scalable latency output signal, to enable a user to tune the output for a specific purpose or application. The output audio signal can have less non-linear phase (and therefore a more linearized phase) at the expense of increased latency. The system can also be tuned such that the user can reduce the non-linear phase to a maximum acceptable level, which can correspond to a minimum latency of the output signal.

Figure 2:
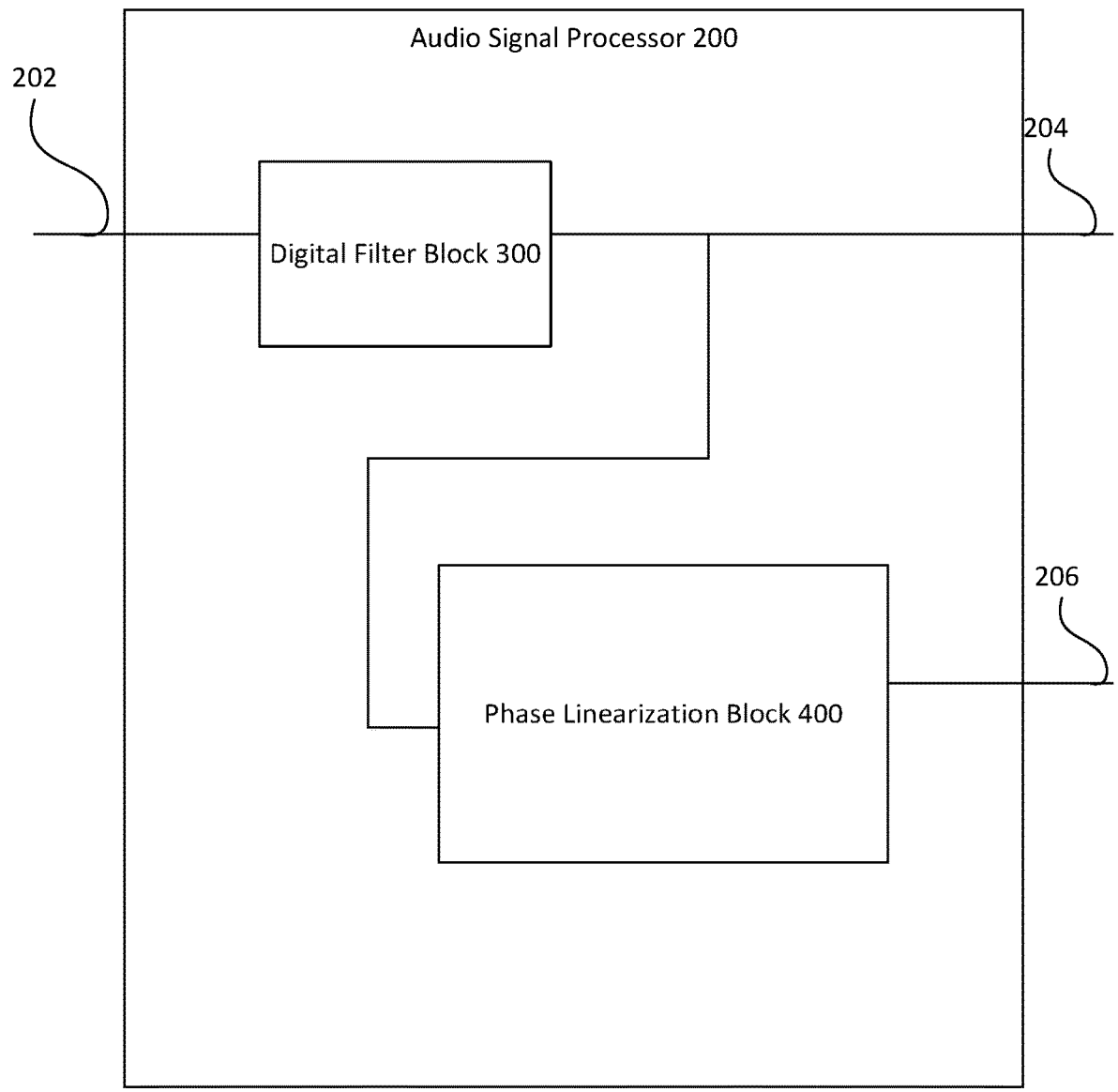
FIG. 2 is a simplified schematic diagram of an audio signal processor, in accordance with some embodiments.
Figure 3:
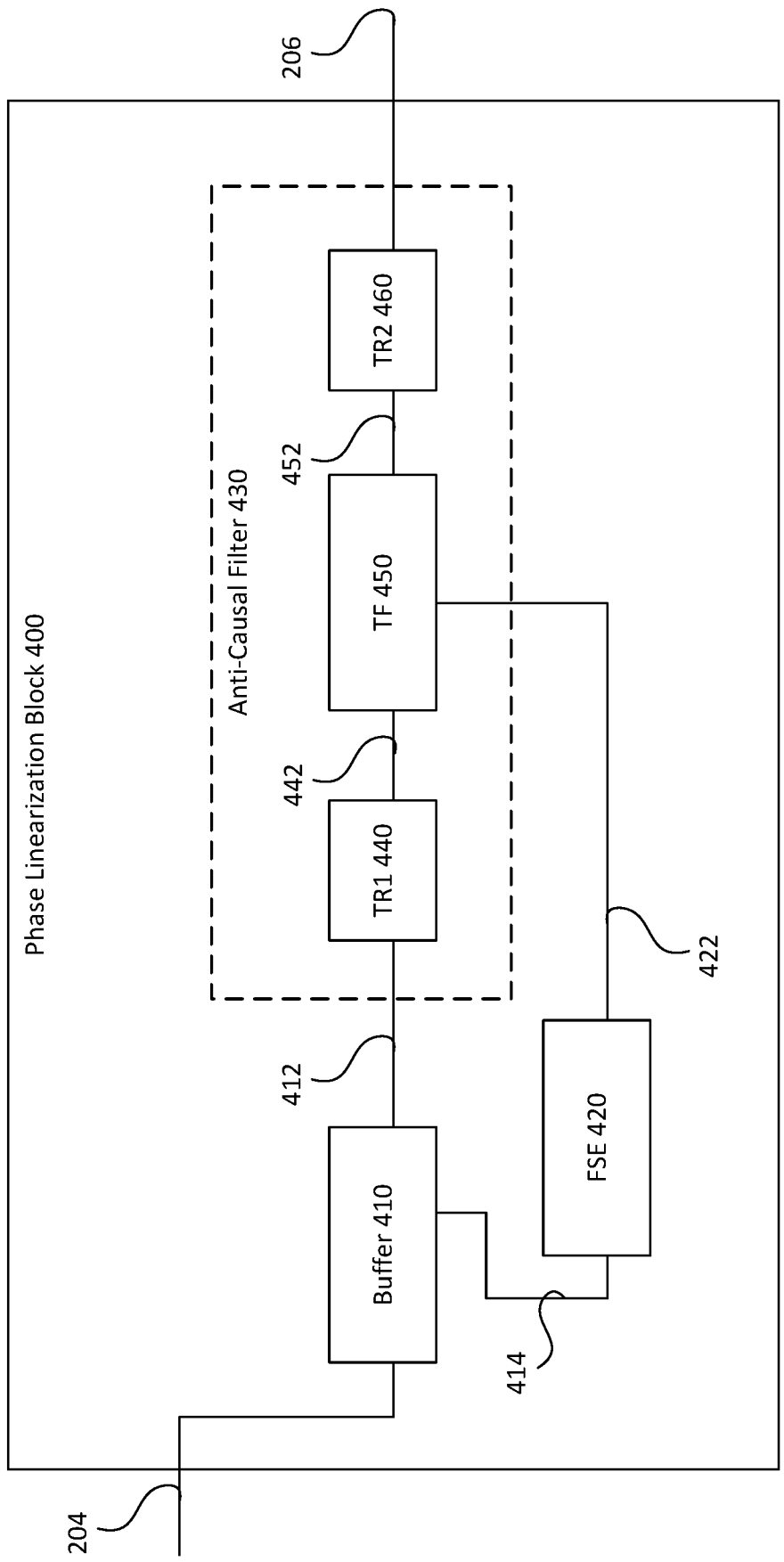
FIG. 3 is a simplified schematic diagram of a phase linearization block of the audio signal processor of FIG. 2, in accordance with some embodiments.

FIGS. 1, 2, and 3 illustrate simplified schematic diagrams of an audio system 100 including a transmitter 110 and a receiver 120 (FIG. 1), an audio signal processor 200 of the receiver 120 (FIG. 2), and a phase linearization block 400 of the audio signal processor 200 (FIG. 3).

The audio system 100 shown in FIG. 1 is a simplified system, including a single transmitter 110 and receiver 120. The audio system 100 may enable wireless transmission of audio signals via one or more antennas. One of ordinary skill in the art would appreciate that although a single transmitter and a single receiver are shown, the system may include multiple transmitters and/or receivers, and that each of the transmitter 110 and receiver 120 may perform both transmission and reception of wireless signals. The receiver may be a wireless audio device such as wireless earphones, a wireless conference unit, body pack, in-ear wireless monitor, microphone, intercom device, and more. The audio system 100 may also include an audio source (not shown) in communication with the transmitter 110. The audio source may generate one or more audio source signals.

In some examples, the phase linearization block may be used only by the receiver, at the decoding side, to address issues of non-linear phase in the audio signal. The phase linearization may be decoupled from the transmitter.

In some embodiments, the receiver 120 includes an audio signal processor 200. The audio signal processor 200 operates using a two filter technique, wherein a first filter operates as a digital filter block 300, and a second filter operates as a phase linearization block 400.

The audio signal processor provides an overall linear phase IIR filter that is realized using a combination of two-pass filtering and time reversal. The first pass can be performed in a forward direction using a stable recursive digital filter (e.g., the digital filter block 300), and the second pass can be performed in a backward direction using a non-causal subsystem (e.g., the phase linearization block 400). The phase linearization block 400 may be implemented using two time reversal operations and a stable recursive digital filter, as shown in FIG. 3.

Regarding the first pass, the digital filter block 300 may include an IIR digital filter, which operates according to a transfer function H(z). The same transfer function H(z) can also be used in the anti-causal filter of the second pass, as described in further detail below. In order to achieve linear phase using the IIR of the digital filter block, one technique is to implement an operation on the audio signal that is $H(z) \times H(z^{-1})$. Using this operation, the two-pass processing becomes a zero phase system with unit gain. This combined operation, however, is no longer an all-pass filter, and as a result is unstable. Embodiments of the present disclosure address this problem by implementing the reverse filter (i.e., $H(z^{-1})$) using a non-causal approach.

Referring back to the digital filter block 300, this block 300 includes an infinite impulse response (IIR) filter, wherein the digital filter block 300 is configured to receive audio signal 202 and output a first filtered audio signal 204. This is shown best in FIG. 2.

In some embodiments, the audio signal 202 is filtered for a variety of different applications, such as audio coding or for parametric equalization for spectrum balance or emphasis. The digital filter block 300 includes an IIR filter in order to relieve processing delay and computational load which would otherwise be relatively difficult to overcome using a FIR filter.

In a typical audio transmission scenario, an IIR is used by the transmitter to split the full-band audio signal into several subbands. The subband audio signals are encoded and transmitted to the receiving side, and further decoded via IIR reconstruction filters in the digital filter block 300. The reconstructed audio signal 204 can be directly fed as an output of the audio signal processor 200. In this case, the audio signal 204 output directly by the digital filter block 300 may have a non-linear-phase with a short delay. Alternatively, the audio signal processor 200 can include further processing of the audio signal 204 using the phase linearization block 400, to remove or address the non-linear phase.

As noted above, the digital filter block 300 includes an IIR filter. It should be appreciated that this can include any type of IIR filter. In some examples, the IIR filter is an IIR QMF filter bank structure that is designed to be highly efficient. This IIR filter bank may use recursive all-pass filters in a poly-phase structure for a variety of design advantages both on a DSP or FPGA, at the expense of introducing a potential artifact, non-linear phase. In some examples, the IIR filter bank includes an N-channel IIR filter bank that has high subband isolation and moderate subband separation. Here, N may be any number larger than or equal to two. High subband isolation provides less aliasing or imaging between subbands. In the N-channel tree-structured IIR filter bank, peaks in the group delay occur at the subband edges, because the subband edges are frequency regions that require the largest change in phase response to create a transition from zero filtering to maximal filtering. Using moderate subband separation reduces the 'peakiness' or magnitude of the group delay.

Figure 4:
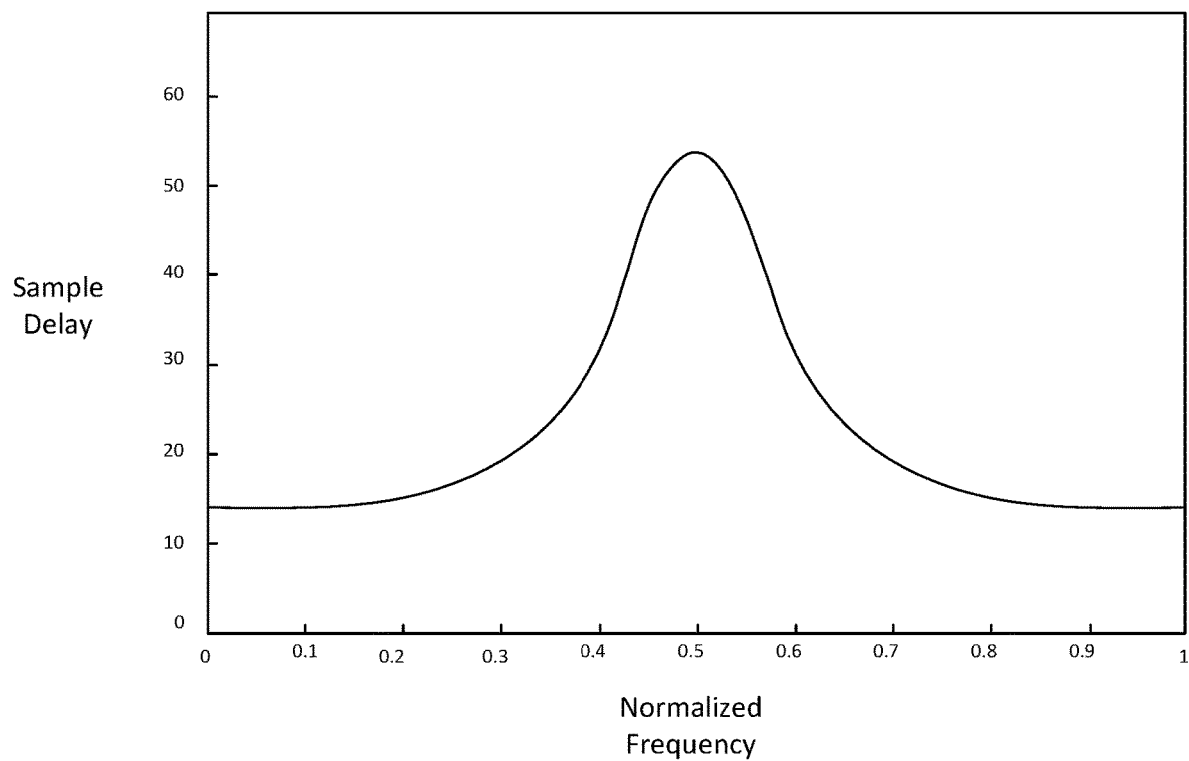
FIG. 4 is a graph illustrating an example non-linear phase or non-constant group delay in an output signal, in accordance with some embodiments.

FIG. 4 illustrates an example graph of the group delay response (in symbols vs. normalized frequency) that occurs when using the IIR filters of the present disclosure. The peak group delay happens at the edges of the sub bands, as noted by the large peak shown in the graph (e.g., at 12 kHz if sampled at 48 kHz). As a result of passing through the digital filter block which introduces the non-linear phase or group delay (such as that shown in FIG. 4), the output 204 has a non-linear phase or non-constant group delay which may have artifacts depending on the signal characteristics. Nevertheless, the output 204 of the digital filter block 300 may be made available as an output of the audio signal processor 200. The output 204 may be useful for certain applications, due to its low latency/delay, even though it has a non-linear phase/non-constant group delay.

Where the user or application of the audio signal processor requires or benefits from an audio signal with a more linear phase or more constant group delay, the audio signal 204 may be passed through a second phase linearization block 400, as shown in FIG. 2. The phase linearization block 400 may be configured to reduce the non-linear phase of the first filtered audio signal 204 output by the digital filter block 300. At a high level, this reduction in non-linearity of the phase is performed by trading off a greater reduction in the non-linear phase of the first filtered audio signal with an increased latency in providing the second filtered audio signal. The phase linearization block, when it processes the first output audio signal 204, introduces an added latency while reducing the non-linearity of the phase.

In the illustrated embodiment, the phase linearization block 400 includes a buffer 410, a filter state estimation (FSE) block 420, and an anti-causal filter 430.

The buffer 410 is configured to receive the first filtered audio signal 204 from the digital filter block 300, and output a buffer signal 412. The buffer is also configured to output a second signal 414, to be used by the filter state estimation block 420.

The filter state estimation block 420 is configured to perform historical state reconstruction based on the first filtered audio signal 204, and to output a state estimation signal 422. In some examples, the state of the audio signal 202 input to the audio processing device 200 is the same as the state of the transfer function (H(z)) of the transfer function block 450. If this is true, the output 206 should be the same as the input 202, but with an added delay (and a reduced phase non-linearity). Since the state of the audio signal 202 is known by the transmitter (and not by the receiver), this is accomplished by estimating the filter state using filter state estimation block 420 for use by transfer function block 450 of the anti-causal filter 430.

When the system begins processing an audio signal, the filter estimation block 420 aids in ramping up the anti-causal filter 430, since the anti-causal filter does not perform an overlap-and-add operation.

In some examples, as the delay introduced by the phase linearization block 400 increases (i.e., when the user selects a more delayed output from the scalable audio signal processor), the filter state estimations becomes less crucial due to the decaying effect of the filter impulse response. In some examples, where a latency of greater than approximately 4-5 ms is introduced by the phase linearization block 400, filter state estimation may be eliminated in order to save computation and reduce complexity.

In some examples, the phase linearization block 400 also includes an anti-causal filter 430 configured to receive the buffer signal 412 and the state estimation signal 422, and output a second filtered audio signal 206. The anti-causal filter 430 may operate on the buffer signal 412 using a block cascade, using a non-overlapped cascade of block samples sequentially.

The illustrated anti-causal filter comprises a first time reverse block 440, a transfer function block 450, and a second time reverse block 460. The first time reverse block 440 is configured to receive the buffer signal 412 and output a time-reversed signal 442.

The transfer function block 450 is configured to receive the state estimation signal 422 from the filter state estimation block 420, and the time-reversed signal 442 from the first time reverse block 440, and output a signal 452. The transfer function block 450 may be similar or identical to the digital filter block in one or more respects, by including a similar or identical IIR filter.

The second time reverse block 460 is configured to receive the output signal 452 from the transfer function block 450, and output the second filtered signal 206.

As noted above, FIG. 4 illustrates an example graph showing the delay in samples vs. normalized frequency, when no phase linearization is performed. This may be, for example, the delay function of the first output audio signal 204.

Figure 5:
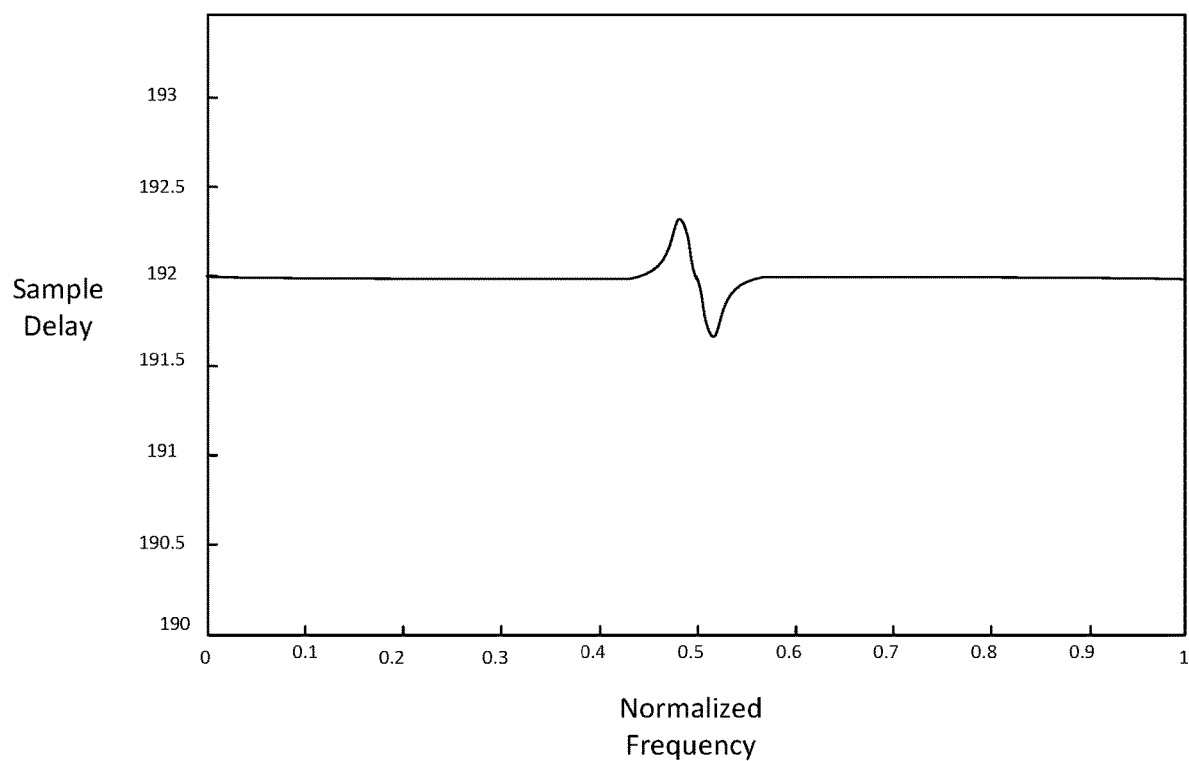
FIG. 5 is a graph illustrating an example linearized phase in a second output signal after passing through the phase linearization block of FIG. 3, in accordance with some embodiments.

FIG. 5 illustrates an example graph showing the delay in samples vs. normalized frequency after phase linearization has been performed. This may be, for example, the delay function of the second output audio signal 206 after the first output audio signal 204 has passed through the phase linearization block 400. As can be seen, the variance in sample delay across the normalized frequency spectrum is less than 1 sample. This is compared to a variance of approximately 40 samples in the first filtered audio output, as shown in FIG. 4.

As illustrated in FIG. 2, the output of the signal processor 200 may comprise both the first filtered audio signal 204 and the second filtered audio signal 206. In some examples, there may be only one output audio signal which is selectable by a user. Additionally, the latency of the output audio signal(s) are scalable and selectable by a user. The output audio signals can include non phase-linearized audio (e.g., output audio signal 204) and phase-linearized audio (e.g., output audio signal 206) for different applications. In still further examples, the second output audio signal may have a scalable latency, such that the degree of phase linearization is scalable as well. A user may increase the latency, causing an increase in the phase linearization (e.g., decreasing the variance in sample delay). The user may also decrease the latency, causing a decrease in the phase linearization (e.g., increasing the variance in sample delay).

As illustrated above, the second filtered audio signal 206 has a more linear phase or greater degree of phase linearization than the first filtered audio signal 204. As a consequence, the second filtered audio signal 206 also includes a greater latency than the first filtered audio signal 204.

In some examples, a Perceptual Evaluation of Audio Quality (PEAQ) score can be determined for the outputs of the audio signal processor 200. The first filtered audio signal 204 includes a lowest delay (e.g., non-constant group delay). The second filtered audio signal 206 may include a relatively longer delay (e.g., in the range of 3-5 ms longer than output 204). The second filtered audio signal 206 includes a similar PEAQ score (−0.05 to +0.05 change), along with a more linear phase. In some examples, where the delay is increased such that the second filtered audio signal 206 includes a delay of 6-8 ms longer than output 204, the PEAQ score of the second filtered audio signal 206 may be the same or greater than the PEAQ score of the first filtered audio signal 204. The second filtered audio signal 206 may also have a better signal to noise ratio (SNR) than the first filtered audio signal 204. Further, where a longer delay is introduced (e.g., 6-8 ms vs 3-5 ms), the output signal having the longer delay may have a better SNR.

In one example, the second filtered audio output 206 is delayed by less than 5 ms with respect to the first filtered audio output 204, and the second filtered audio output 206 has a perceptual evaluation of audio quality (PEAQ) score within 0.05 of a PEAQ score of the first filtered audio signal 204.

In a second example, the second filtered audio output 206 is delayed by 5-8 ms with respect to the first filtered audio output 204, and the second filtered audio output 206 has a perceptual evaluation of audio quality (PEAQ) score greater than a PEAQ score of the first filtered audio signal 204.

Various aspects of the embodiments of the present disclosure may be digital, and may be performed by a computing device. In some examples, both the transmitter 110 and the receiver 120 may be computing devices. An example computing device of the present disclosure may include one or more components such as a processor, memory, user interface, and communication interface, all communicatively coupled by a system bus, network, or other connection mechanism. It should be understood that examples disclosed herein may refer to computing devices and/or systems having components that may or may not be physically located in proximity to each other. Certain embodiments may take the form of cloud based systems or devices, and the term "computing device" should be understood to include distributed systems and devices (such as those based on the cloud), as well as software, firmware, and other components configured to carry out one or more of the functions described herein. Further, as noted above, one or more features of a computing device may be physically remote and may be communicatively coupled to the computing device, via the communication interface for example.

A processor of the computing device may include a general purpose processor (e.g., a microprocessor) and/or a special purpose processor (e.g., a digital signal processor (DSP)). The processor may be any suitable processing device or set of processing devices such as, but not limited to, a microprocessor, a microcontroller-based platform, an integrated circuit, one or more field programmable gate arrays (FPGAs), and/or one or more application-specific integrated circuits (ASICs).

The memory of the computing device may be volatile memory (e.g., RAM including non-volatile RAM, magnetic RAM, ferroelectric RAM, etc.), non-volatile memory (e.g., disk memory, FLASH memory, EPROMs, EEPROMs, memristor-based non-volatile solid-state memory, etc.), unalterable memory (e.g., EPROMs), read-only memory, and/or high-capacity storage devices (e.g., hard drives, solid state drives, etc.). In some examples, the memory includes multiple kinds of memory, particularly volatile memory and non-volatile memory. The memory may be computer readable media on which one or more sets of instructions, such as the software for operating the methods of the present disclosure, can be embedded. The instructions may embody one or more of the methods or logic as described herein. For example, the instructions reside completely, or at least partially, within any one or more of the memory, the computer readable medium, and/or within the processor during execution of the instructions.

The terms "non-transitory computer-readable medium" and "computer-readable medium" include a single medium or multiple media, such as a centralized or distributed database, and/or associated caches and servers that store one or more sets of instructions. Further, the terms "non-transitory computer-readable medium" and "computer-readable medium" include any tangible medium that is capable of storing, encoding or carrying a set of instructions for execution by a processor or that cause a system to perform any one or more of the methods or operations disclosed herein. As used herein, the term "computer readable medium" is expressly defined to include any type of computer readable storage device and/or storage disk and to exclude propagating signals.

The user interface of the computing device may facilitate interaction with a user of the device. As such, the user interface may include input components such as a keyboard, a keypad, a mouse, a touch-sensitive panel, a microphone, and a camera, and output components such as a display screen (which, for example, may be combined with a touch-sensitive panel), a sound speaker, and a haptic feedback system. The user interface may also comprise devices that communicate with inputs or outputs, such as a short-range transceiver (RFID, Bluetooth, etc.), a telephonic interface, a cellular communication port, a router, or other types of network communication equipment. The user interface may be internal to the computing device, or may be external and connected wirelessly or via connection cable, such as through a universal serial bus port.

The communication interface of the computing device may be configured to allow the computing device to communicate with one or more devices (or systems) according to one or more protocols. In one example, the communication interface may be a wired interface, such as an Ethernet interface or a high-definition serial-digital-interface (HD-SDI). As another example, the communication interface 40 may be a wireless interface, such as a cellular, Bluetooth, or Wi-Fi interface. In some examples, the communication interface may include one or more antennas, and may be configured to transmit and/or receive RF signals.

The data bus of the computing device may include one or more wires, traces, or other mechanisms for communicatively coupling the processor, memory, user interface, and communication interface, and or any other applicable computing device component.

Figure 6:
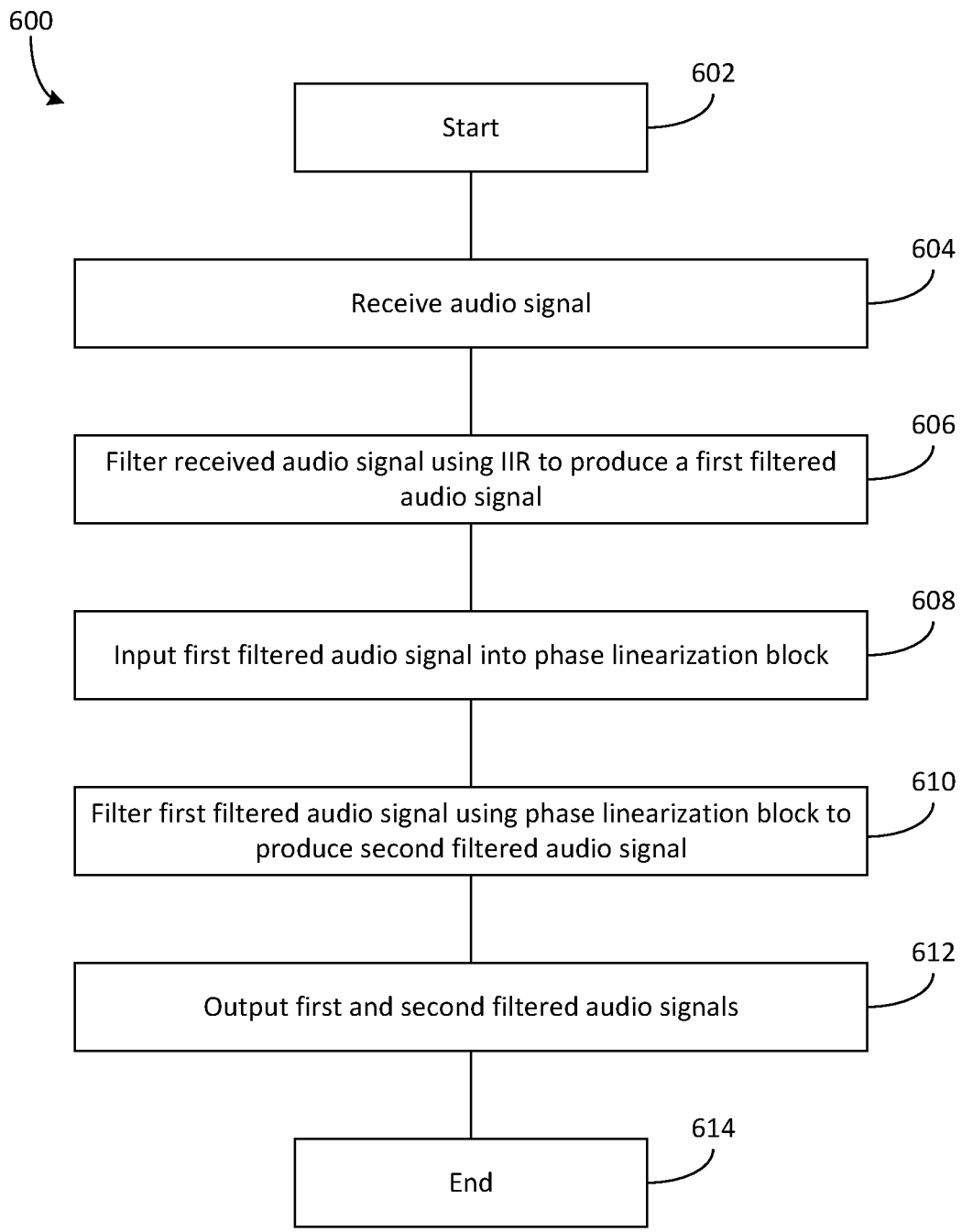
FIG. 6 is a flowchart illustrating an example method, in accordance with some embodiments.

FIG. 6 illustrates a flow chart of an example method 600 according to embodiments of the present disclosure. Method 600 may enable the operation of a digital audio signal processor to provide one or more outputs that are passed through a phase linearization module. The flowchart of FIG. 6 is representative of machine readable instructions that are stored in memory and may include one or more programs which, when executed by a processor may cause one or more computing devices and/or systems to carry out one or more functions described herein. While the example program is described with reference to the flowchart illustrated in FIG. 6, many other methods for carrying out the functions described herein may alternatively be used. For example, the order of execution of the blocks may be rearranged or performed in series or parallel with each other, blocks may be changed, eliminated, and/or combined to perform method 600. Further, because method 600 is disclosed in connection with the components of FIGS. 1-5, some functions of those components will not be described in detail below.

Method 600 starts at block 602. At block 604, method 600 includes receiving an audio signal. This can include a receiver receiving a transmitted audio signal from a transmitter, as shown in FIG. 1.

At block 606, method 600 includes filtering the received audio signal using an IIR to produce a first filtered audio signal. This process is described above with respect to the digital filter block 300 to generate the output audio signal 204.

At block 608, method 600 includes inputting the first filtered audio signal from block 606 into a phase linearization block. As described above with respect to phase linearization block 400, the phase linearization block 400 may include a buffer, a filter state estimation block, and an anti-causal filter. The anti-causal filter may include a first time reversal block, a transfer function block, and a second time reversal block.

At block 610, method 600 includes filtering the first filtered audio signal using the phase linearization block, to produce a second filtered audio signal, e.g., output audio signal 206. As described above, the second filtered audio signal includes a more linear phase than the first filtered audio signal, and has a higher latency than the first filtered audio signal. Additionally, the latency of the second filtered audio signal can be adjusted to tune the linearity of the resulting phase. For example, if a second filtered output signal with a more linear phase is desired, the latency introduced by the phase linearization block may be increased.

At block 612, method 600 may include providing the first filtered audio signal and the second filtered audio signal as outputs. The method may then end at block 614.

Any process descriptions or blocks in figures should be understood as representing modules, segments, or portions of code which include one or more executable instructions for implementing specific logical functions or steps in the process, and alternate implementations are included within the scope of the embodiments of the invention in which functions may be executed out of order from that shown or discussed, including substantially concurrently or in reverse order, depending on the functionality involved, as would be understood by those having ordinary skill in the art.

This disclosure is intended to explain how to fashion and use various embodiments in accordance with the technology rather than to limit the true, intended, and fair scope and spirit thereof. The foregoing description is not intended to be exhaustive or to be limited to the precise forms disclosed. Modifications or variations are possible in light of the above teachings. The embodiment(s) were chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the embodiments as determined by the appended claims, as may be amended during the pendency of this application for patent, and all equivalents thereof, when interpreted in accordance with the breadth to which they are fairly, legally and equitably entitled.

The invention claimed is:

1. An audio signal processor comprising:
a digital filter block comprising an infinite impulse response filter, wherein the digital filter block is configured to receive an audio signal and output a first filtered audio signal; and
a phase linearization block comprising:
a buffer configured to receive the first filtered audio signal and output a buffer signal;
a filter state estimation block configured to perform historical state reconstruction based on the first filtered audio signal, and to output a state estimation signal; and
an anti-causal filter configured to receive the buffer signal and the state estimation signal, and output a second filtered audio signal,
wherein an output of the audio signal processor comprises both the first filtered audio signal and the second filtered audio signal.

2. The audio signal processor of claim 1, wherein the first filtered audio signal output by the digital filter block includes a non-linear phase.

3. The audio signal processor of claim 2, wherein the phase linearization block is configured to reduce the non-linear phase of the first filtered audio signal.

4. The audio signal processor of claim 2, wherein the phase linearization block is configured to tradeoff providing a greater reduction in the non-linear phase of the first filtered audio signal with an increased latency in providing the second filtered audio signal.

5. The audio signal processor of claim 1, wherein the second filtered audio signal has a more linear phase than the first filtered audio signal.

6. The audio signal processor of claim 1, wherein the second filtered audio signal includes a greater latency than the first filtered audio signal.

7. The audio signal processor of claim 1, wherein the anti-causal filter operates using a block cascade method.

8. The audio signal processor of claim 1, wherein the anti-causal filter comprises:
- a first time reverse block configured to receive the buffer signal and output a time-reversed signal;
- a transfer function block configured to receive the state estimation signal from the filter state estimation block and the time-reversed signal from the first time reverse block; and
- a second time reverse block configured to receive an output from the transfer function block, and output the second filtered audio signal.

9. The audio signal processor of claim 1, wherein the second filtered audio signal is delayed by less than 5 ms with respect to the first filtered audio signal, and wherein the second filtered audio signal has a perceptual evaluation of audio quality (PEAQ) score within 0.05 of a PEAQ score of the first filtered audio signal.

10. The audio signal processor of claim 1, wherein the second filtered audio signal is delayed by 5-8 ms with respect to the first filtered audio signal, and wherein the second filtered audio signal has a perceptual evaluation of audio quality (PEAQ) score greater than a PEAQ score of the first filtered audio signal.

11. A method of operating a digital audio signal processor comprising:
- filtering a received audio signal using an infinite impulse response filter, to produce a first filtered audio signal;
- inputting the first filtered audio signal into a phase linearization block, wherein the phase linearization block comprises:
  - a buffer configured to receive the first filtered audio signal and output a buffer signal;
  - a filter state estimation block configured to perform historical state reconstruction based on the first filtered audio signal, and to output a state estimation signal; and
  - an anti-causal filter configured to receive the buffer signal and the state estimation signal, and output a second filtered audio signal; and
- outputting both the first filtered audio signal and the second filtered audio signal.

12. The method of claim 11, wherein the first filtered audio signal includes a non-linear phase, further comprising reducing the non-linear phase of the first filtered audio signal using the phase linearization block.

13. The method of claim 11, wherein the second filtered audio signal has a more linear phase than the first filtered audio signal.

14. The method of claim 11, wherein the second filtered audio signal includes a greater latency than the first filtered audio signal.

15. The method of claim 11, wherein the anti-causal filter operates using a block cascade method.

16. The method of claim 11, wherein the anti-causal filter comprises:
- a first time reverse block configured to receive the buffer signal and output a time-reversed signal;
- a transfer function block configured to receive the state estimation signal from the filter state estimation block and the time-reversed signal from the first time reverse block; and
- a second time reverse block configured to receive an output from the transfer function block, and output the second filtered audio signal.

17. The method of claim 11, wherein the second filtered audio signal is delayed by less than 5 ms with respect to the first filtered audio signal, and wherein the second filtered audio signal has a perceptual evaluation of audio quality (PEAQ) score within 0.05 of a PEAQ score of the first filtered audio signal.

18. The method of claim 11, wherein the second filtered audio signal is delayed by 5-8 ms with respect to the first filtered audio signal, and wherein the second filtered audio signal has a perceptual evaluation of audio quality (PEAQ) score greater than a PEAQ score of the first filtered audio signal.

19. A non-transitory, computer readable memory having instructions stored thereon that, when executed by a processor, cause the performance of a set of acts comprising:
- filtering a received audio signal using an infinite impulse response filter, to produce a first filtered audio signal;
- inputting the first filtered audio signal into a phase linearization block, wherein the phase linearization block comprises
  - a buffer configured to receive the first filtered audio signal and output a buffer signal;
  - a filter state estimation block configured to perform historical state reconstruction based on the first filtered audio signal, and to output a state estimation signal; and
  - an anti-causal filter configured to receive the buffer signal and the state estimation signal, and output a second filtered audio signal; and
- outputting both the first filtered audio signal and the second filtered audio signal.

20. The non-transitory, computer-readable memory of claim 19, wherein the anti-causal filter comprises:
- a first time reverse block configured to receive the buffer signal and output a time-reversed signal;
- a transfer function block configured to receive the state estimation signal from the filter state estimation block and the time-reversed signal from the first time reverse block; and
- a second time reverse block configured to receive an output from the transfer function block, and output the second filtered audio signal.

* * * * *